(12) United States Patent
Zhou (10) Patent No.: US 10,686,078 B2
(45) Date of Patent: Jun. 16, 2020

(54) SEMICONDUCTOR STRUCTURE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Fei Zhou, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 16/044,272

(22) Filed: Jul. 24, 2018

(65) Prior Publication Data

US 2019/0035932 A1    Jan. 31, 2019

(30) Foreign Application Priority Data

Jul. 25, 2017   (CN) .......................... 2017 1 0611846

(51) Int. Cl.
| | | |
|---|---|---|
| H01L 29/78 | (2006.01) | |
| H01L 21/82 | (2006.01) | |
| H01L 29/66 | (2006.01) | |
| H01L 21/84 | (2006.01) | |
| H01L 21/265 | (2006.01) | |
| H01L 21/8238 | (2006.01) | |
| H01L 21/266 | (2006.01) | |
| H01L 29/165 | (2006.01) | |

(52) U.S. Cl.
CPC ........ *H01L 29/7851* (2013.01); *H01L 21/266* (2013.01); *H01L 21/26586* (2013.01); *H01L 21/823821* (2013.01); *H01L 21/845* (2013.01); *H01L 29/66545* (2013.01); *H01L 29/66795* (2013.01); *H01L 29/66803* (2013.01); *H01L 29/7848* (2013.01); *H01L 29/165* (2013.01)

(58) Field of Classification Search
None
See application file for complete search history.

(56) References Cited

U.S. PATENT DOCUMENTS

| | | | | |
|---|---|---|---|---|
| 10,062,784 | B1* | 8/2018 | Lee ..................... | H01L 29/4966 |
| 2016/0163833 | A1* | 6/2016 | He ...................... | H01L 29/7848 257/401 |
| 2016/0204105 | A1* | 7/2016 | Zeng ............... | H01L 21/823807 257/401 |
| 2016/0284851 | A1* | 9/2016 | Lo ........................ | H01L 29/6656 |
| 2018/0040715 | A1* | 2/2018 | Chang ................. | H01L 21/0273 |
| 2018/0166327 | A1* | 6/2018 | Hsiao ................ | H01L 21/76802 |

FOREIGN PATENT DOCUMENTS

CN          105719969 A       6/2016

* cited by examiner

*Primary Examiner* — Minh Loan Tran
(74) *Attorney, Agent, or Firm* — Anova Law Group, PLLC (57) ABSTRACT

A semiconductor structure and fabrication method are provided. The method includes: providing a substrate; forming first fins on the substrate; forming barrier layers covering sidewalls of the first fins; forming a first groove in each first between the adjacent first barrier layers; and forming a first inner epitaxial layer in each first groove. The first fin and the adjacent first barrier layers surround the corresponding first groove.

19 Claims, 6 Drawing Sheets

SEMICONDUCTOR STRUCTURE AND FABRICATION METHOD THEREOF

CROSS-REFERENCES TO RELATED APPLICATION

This application claims the priority of Chinese Patent Application No. 201710611846.2, filed on Jul. 25, 2017, the content of which is incorporated herein by reference in its entirety.

TECHNICAL FIELD

The present disclosure generally relates to the field of semiconductor technologies and, more particularly, relates to a semiconductor structure and its fabrication method.

BACKGROUND

Semiconductor devices are developed toward a direction with a higher device density and a higher integration level. A transistor is one of the most fundamental semiconductor devices and is widely used. As the device density and the integration level in the semiconductor device increases, critical dimensions of transistors decrease. As the critical dimensions of the transistors decrease, the number of the semiconductor devices on a chip increases, and a distance between adjacent semiconductor devices decreases gradually.

In an epitaxial growth process, a single crystalline layer according to certain requirements is grown on a single crystal substrate, and the single crystalline layer has a crystalline orientation same as the single crystal substrate. The epitaxial growth process is a fundamental growth technology in the semiconductor fabrication technology, and has important applications in forming single crystals. The epitaxial growth process is widely used to form a cathode and an anode of a diode, and source/drain doped regions in metal-oxide-semiconductor (MOS) transistors.

However, performances of semiconductor structures formed by the epitaxial growth process still need to be improved. The disclosed devices and methods are directed to at least partially alleviate one or more problems set forth above and to solve other problems in the art.

SUMMARY

One aspect of the present disclosure provides a fabrication method for forming a semiconductor structure. The method includes: providing a substrate; forming first fins on the substrate; forming barrier layers covering sidewalls of the first fins; forming a first groove in each first fin surrounded by the adjacent first barrier layers; and forming a first inner epitaxial layer in each first groove.

Another aspect of the present disclosure provides a semiconductor structure. The semiconductor structure includes: a substrate; first fins on the substrate, where each first fin includes a first groove through the corresponding first fin along a width direction of the first fins; and a first inner epitaxial layer in each first groove. The first inner epitaxial layer has a width smaller than or equal to a width of the first fins, along the width direction of the first fins.

Other aspects or embodiments of the present disclosure can be understood by those skilled in the art in light of the description, the claims, and the drawings of the present disclosure.

BRIEF DESCRIPTION OF THE DRAWINGS

The following drawings are merely examples for illustrative purposes according to various disclosed embodiments and are not intended to limit the scope of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

Figure 1:
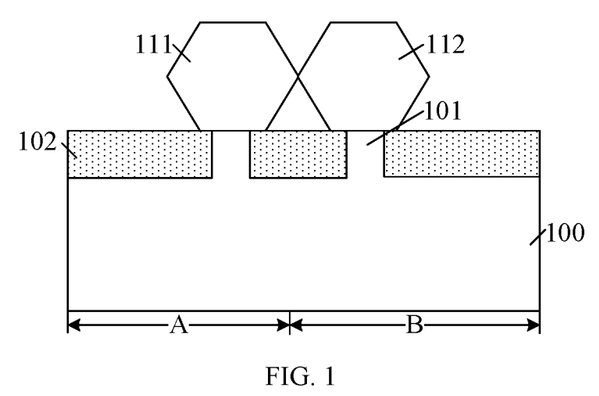
FIG. 1 illustrates a semiconductor structure.

FIG. 1 illustrates a semiconductor structure. A substrate 100 may be provided. The substrate 100 may include a first region A and a second region B adjacent to each other. Fins 101 may be formed on the substrate in the first region A and on the substrate in the second region B respectively. An isolation structure 102 may be formed on the substrate 100 in the first region A and on the substrate 100 in the second region B, to cover a portion of sidewalls of the fins 101. A first epitaxial layer 111 may be formed on each fin 101 in the first region A by a first epitaxial growth process. A second epitaxial layer 112 may be formed on each fin 101 in the second region B by a second epitaxial growth process.

To increase the integration level of the semiconductor structure, a distance between a fin 101 in the first region A and an adjacent fin 101 in the second region B may be small. The first epitaxial layers 111 and the second epitaxial layers 112 cannot have a too-small size, because the first epitaxial layers 111 and the second epitaxial layers 112 have to provide enough strains on channels of transistors. After forming the first epitaxial layers 111 and the second epitaxial layers 112, a distance between the first epitaxial layer 111 and the adjacent second epitaxial 112 may be small, or the first epitaxial layer 111 and the second epitaxial 112 may contact each other. A leakage current between the first epitaxial layer 111 and the adjacent second epitaxial 112 may be large and the formed semiconductor structure may have a poor performance.

The present disclosure provides a semiconductor structure and a fabrication method of the semiconductor structure. The fabrication method may include: providing a substrate and first fins on the substrate; forming first barrier layers to cover sidewalls of the first fins; forming a first groove in each first fin between the adjacent first barrier layers; and forming an inner epitaxial layer in each first groove. The first barrier layers may constrain a size of the first inner epitaxial layer along a direction perpendicular to the sidewalls of the first fins, and may allow the first inner epitaxial layer to grow along a height direction of the first fins. The size of the first inner epitaxial layer along a width direction of the first fins may be reduced and the size of the first inner epitaxial layer along the height direction of the first fins may be increased. Subsequently, a volume of the first inner epitaxial layer may be not too small and strains of the first inner epitaxial layer on the corresponding first fin may be not affected.

FIG. 2 to FIG. 11 illustrate semiconductor structures corresponding to certain stages for forming a semiconductor structure according to various disclosed embodiments of present disclosure. FIG. 12 illustrates an exemplary method for forming a semiconductor structure according to various disclosed embodiments.

Figure 2:
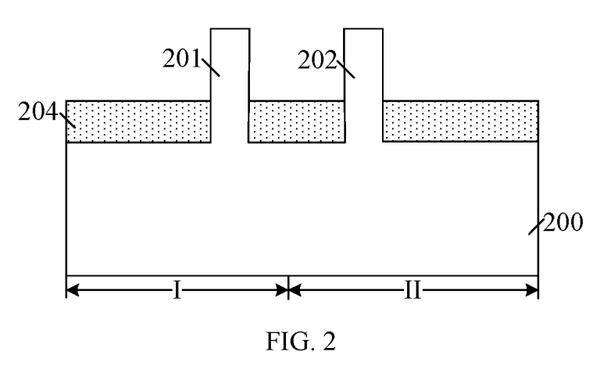
FIG. 2 to FIG. 11 illustrates semiconductor structures corresponding to certain stages for forming an exemplary semiconductor structure according to various disclosed embodiments of the present disclosure.

Referring to FIG. 2, a substrate 200 may be provided. First fins 201 may be formed on the substrate 200 (e.g., in Step S802 in FIG. 12).

In one embodiment, second fins 202 may be further formed on the substrate 200. The first fins 201 and the second fins 202 may be adjacent to each other.

The substrate 200 may include a first region I and a second region II adjacent to each other. The first fins 201 may be formed on the substrate 200 in the first region I, and the second fins 202 may be formed on the substrate 200 in the second region II.

The first region I may be used to form a first semiconductor device, and the second region II may be used to form a second semiconductor device.

In various embodiments, the first semiconductor device may be a MOS transistor, a diode or a transistor. In various embodiments, the second semiconductor device may be a MOS transistor, a diode or a transistor.

In various embodiments, the substrate 200, the first fins 201 and the second fins 202 may be made of a material including silicon, germanium, and/or SiGe.

An isolation structure 204 may be formed on the substrate 200, to cover a portion of sidewalls of the first fins 201 and a portion of sidewalls of the second fins 202 (e.g., in Step S804 in FIG. 12). The isolation structure 204 may have a top surface lower than a top surface of the first fins 201, and lower than a top surface of the second fins 202. The isolation structure 204 may be made of a material including $SiO_2$ and/or $SiN_xO_y$.

Figure 3:
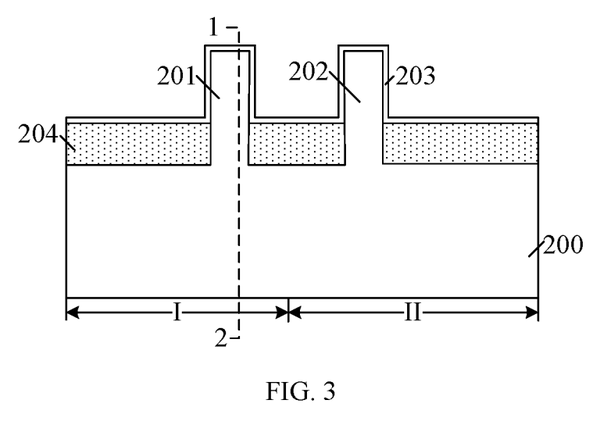

Referring to FIG. 3, an oxide layer 203 may be formed on the top surfaces and the sidewalls of the first fins 201 and of the second fins 202 (e.g., in Step S806 in FIG. 12).

The oxide layer 203 may improve interface states between the first fin 201 and a corresponding first gate structure to be formed thereon, and may improve interface states between the second fin 202 and a corresponding second gate structure to be formed thereon. Then the performance of the formed semiconductor structure may be improved.

In one embodiment, the oxide layer 203 may be made of $SiO_2$. The oxide layer 203 may be formed by a chemical vapor deposition process, an atomic layer deposition process, a physical vapor deposition process, or a thermal oxidizing process.

Figure 4:
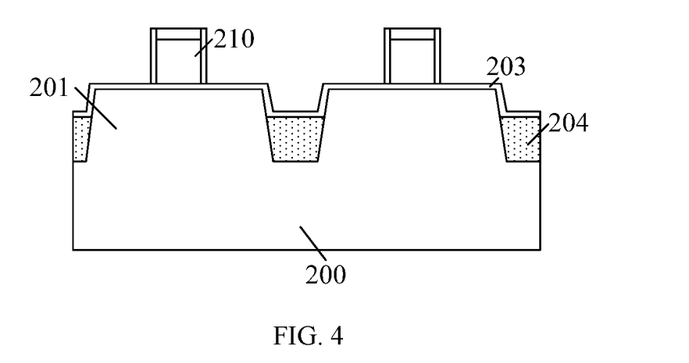

Referring to FIG. 4 which is a cross-section view along a 1-2 direction in FIG. 3, for the first fin 201, a first gate structure 210 may be formed to cross the first fin 201. The first gate structure 210 may cover a portion of the sidewalls and a portion of the top surface of the corresponding first fin 201 (e.g., in Step S808 in FIG. 12). For the second fin 202, a second gate structure may be formed to cross the second fin 202, and the second gate structure may cover a portion of the sidewalls and a portion of the top surface for the corresponding second fin 202.

The first gate structure 210 may be formed on the oxide layer 203 in the first region I, and the second gate structure may be formed on the oxide layer 203 in the second region II.

The first gate structure 210 may include a first gate electrode on the oxide layer 203 in the first region I, a first mask layer on the first gate electrode, and a first spacer wall covering sidewalls of the first gate electrode and covering sidewalls of the first mask layer. The first gate electrode may be a layer covering a portion of the sidewalls of the corresponding first fin 201 and a portion of the top surface of the corresponding first fin 201.

The second gate structure may include a second gate electrode on the oxide layer 203 in the second region II, a second mask layer on the second gate electrode, and a second spacer wall covering sidewalls of the second gate electrode and covering sidewalls of the second mask layer. The second gate electrode may be a layer covering a portion of the sidewalls of the corresponding second fin 202 and a portion of the top surface of the corresponding second fin 202.

In various embodiments, the first gate electrode and the second gate electrode may be made of a material including polysilicon, polygermanium, and/or polycrystalline SiGe. The first spacer wall and the second spacer wall may be made of $SiN_x$ and/or $SiN_xO_y$. The first mask layer and the second mask layer may be made of $SiN_x$ and/or $SiN_xO_y$.

In other embodiments, the first region I may be used to form a diode or a transistor, accordingly the method may not include forming the first gate structure; and the second region II may be used to form a diode or a transistor, accordingly the method may not include forming the second gate structure.

A first epitaxial layer may be formed in the first fin 201, and a second epitaxial layer may be formed in the second fin 202.

The first epitaxial layer may include a first inner epitaxial layer inside the corresponding first fin 201, and a first outer epitaxial layer on a top surface of the first inner epitaxial layer. The second epitaxial layer may include a second inner epitaxial layer inside the corresponding second fin 202, and a second outer epitaxial layer on a top surface of the second inner epitaxial layer. FIGS. 5-11 illustrate a process for forming the first epitaxial layers and the second epitaxial layers.

Subsequently, first barrier layers may be formed on the sidewalls of the first fins 201; and second barrier layers may be formed on the sidewalls of the second fins 202.

Figure 5:
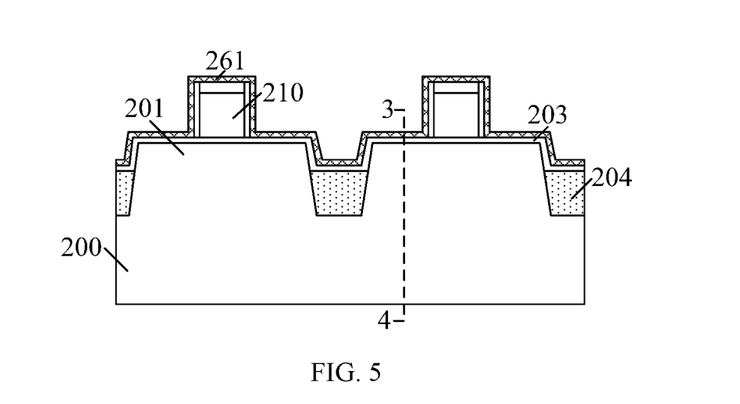
Figure 6:
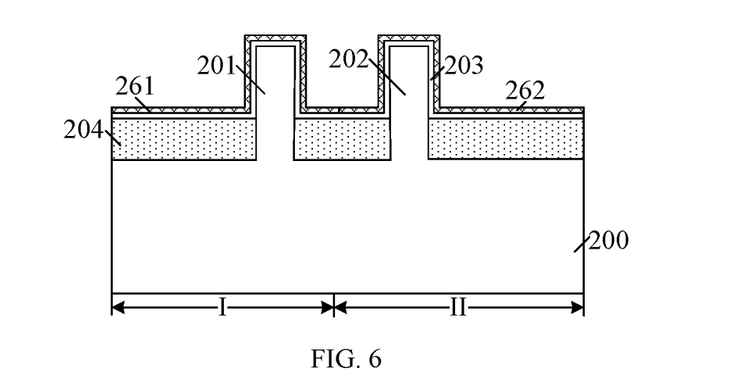

Referring to FIG. 5 and FIG. 6, an initial barrier layer 261 may be formed to cover the sidewalls and the top surfaces of the first fins 201, and a second initial barrier layer 262 may be formed to cover the sidewalls and the top surfaces of the second fins 202 (e.g., in Step S810 in FIG. 12). FIG. 5 is based on FIG. 4, and FIG. 6 is a cross-section view along a 3-4 direction in FIG. 5.

The first initial barrier layer 261 may be used to form first barrier layers and the second initial barrier layer 262 may be used to form second barrier layers.

In various embodiments, the first initial barrier layer 261 may be made of a material same as or different from the second initial barrier layer 262. The first initial barrier layer 261 may be made of a material including $SiO_2$, $SiN_x$, and/or $SiN_xO_y$. The second initial barrier layer 262 may be made of a material including $SiO_2$, $SiN_x$, and/or $SiN_xO_y$.

In one embodiment, the first initial barrier layer 261 and the second initial barrier layer 262 may be formed by a same process including a chemical vapor deposition process and/or a physical vapor deposition process.

When the first initial barrier layer 261 has a too small thickness, a lateral growth of the first inner epitaxial layer may occur. When the first initial barrier layer 261 has a too large thickness, a material of the first initial barrier layer 261 may be wasted. In one embodiment, the first initial barrier layer 261 may have a thickness of about 50 Å to about 200 Å.

When the second initial barrier layer 262 has a too small thickness, a lateral growth of the second inner epitaxial layer may occur. When the second initial barrier layer 262 has a too large thickness, a material of the second initial barrier layer 262 may be wasted. In one embodiment, the second initial barrier layer 262 may have a thickness of about 50 Å to about 200 Å.

In one embodiment, the first initial barrier layer 261 may be formed after forming the first gate structure 210 and the second initial barrier layer 262 may be formed after forming the second gate structure. The first initial barrier layer 261 may further cover the sidewalls and the top surfaces of the first gate structures 210, and the second initial barrier layer 262 may further cover the sidewalls and the top surfaces of the second gate structures.

Figure 7:
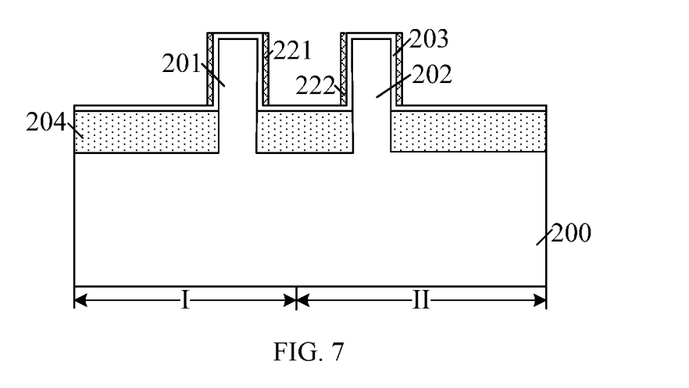

Referring to FIG. 7 which is based on FIG. 6, a portion of the first initial barrier layer 261 on the top surfaces of the first fins 201 may be removed to form first barrier layers 221 covering sidewalls of the first fins 201, and a portion of the second initial barrier layer 262 on the top surfaces of the second fins 202 may be removed to form second barrier layers 222 covering sidewalls of the second fins 202 (e.g., in Step S812 in FIG. 12).

The first barrier layer 221 may constrain a lateral growth of the first inner epitaxial layer along a direction perpendicular to the sidewalls of the first fins 201, and may allow a growth of the first inner epitaxial layer along a height direction of the first fin 201. The size of the first inner epitaxial layer along a width direction of the first fin 201 may be small. The first inner epitaxial layer may be prevented from contacting or being too close to other devices on the substrate 200. Leakage currents in the formed semiconductor structure may be reduced and the performance of the semiconductor structure may be improved.

The second barrier layer 222 may constrain a lateral growth of the second inner epitaxial layer along a direction perpendicular to the sidewalls of the second fin 202, and may allow a growth of the second inner epitaxial layer along a height direction of the second fin 202. The size of the second inner epitaxial layer along a width direction of the second fin 202 may be small. The second inner epitaxial layer may be prevented from contacting or being too close to other devices on the substrate 200. Leakage currents in the formed semiconductor structure may be reduced and the performance of the semiconductor structure may be improved.

A portion of the first initial barrier layer 261 on the top surface of the first fins 201 and a portion of the second initial barrier layer 262 on the top surfaces of the second fins 202 may be removed by an anisotropic dry etching process.

Figure 8:
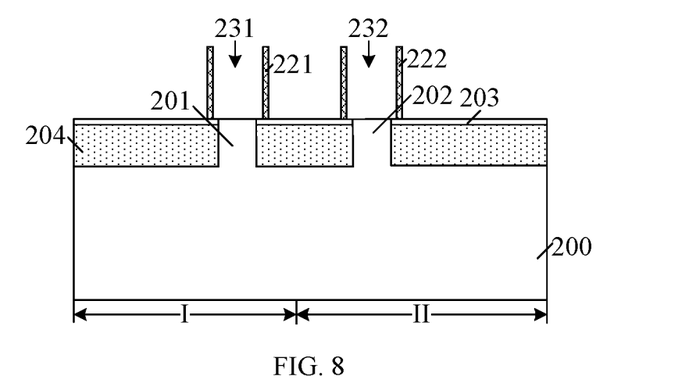

Referring to FIG. 8, a first groove 231 may be formed in the first fin 201 between adjacent first barrier layers 221. The first barrier layers 221 and the first fin 201 may surround the first groove 231 (e.g., in Step S814 in FIG. 12). A second groove 232 may be formed in the second fin 202 between adjacent second barrier layers 221. The second barrier layers 222 and the second fin 202 may surround the second groove 232.

The first groove 231 may accommodate the first inner epitaxial layer and the second groove 232 may accommodate the second inner epitaxial layer.

The first groove 231 may be formed by etching the first fin 201 using the first gate structure 210 as a mask, and the second groove 232 may be formed by etching the second fin 202 using the second gate structure as a mask. The first groove 231 may be formed in the first fin 201 at two sides of the first gate structure 210, and the second groove 232 may be formed in the second fin 202 at two sides of the second gate structure.

The first fins 201 and the second fins 202 may be etched by a dry etching process, a wet etching process, or a combination thereof.

Figure 9:
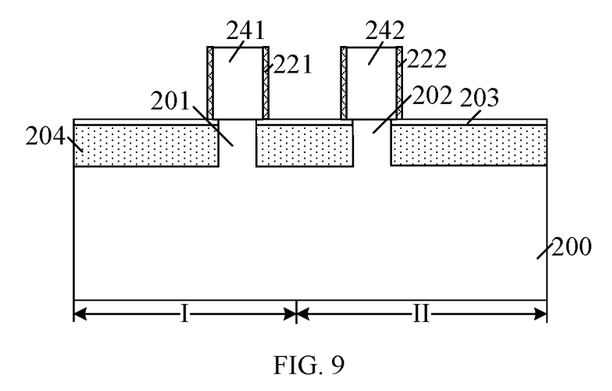

Referring to FIG. 9, a first inner epitaxial layer 241 may be formed in the first groove 231 and a second inner epitaxial layer 242 may be formed in the second groove 232 (e.g., in Step S816 in FIG. 12).

The first inner epitaxial layer 241 may be used to form a source and/or a drain for the first semiconductor device, and the second inner epitaxial layer 242 may be used to form a source and/or a drain for the second semiconductor device.

When forming the first inner epitaxial layer 241, the first barrier layers 221 may constrain a lateral growth of the first inner epitaxial layer 241 along a direction perpendicular to the sidewalls of the first fin 201. The size of the first inner epitaxial layer 241 along a width direction of the first fin 201 may be small. Correspondingly, the size of the first epitaxial layer along a width direction of the first fin 201 may be small, and the first epitaxial layer may be prevented from contacting or being too close to the second epitaxial layer.

When forming the second inner epitaxial layer 242, the second barrier layers 222 may constrain a lateral growth of the second inner epitaxial layer 242 along a direction perpendicular to the sidewalls of the second fin 202. The size of the second inner epitaxial layer 242 along a width direction of the second fin 202 may be small. Correspondingly, the size of the second epitaxial layer along a width direction of the second fin 202 may be small, and the second epitaxial layer may be prevented from contacting or being too close to the first epitaxial layer.

In one embodiment, the first semiconductor device and the second semiconductor device may be MOS transistors, and may have a same type. Accordingly, the first inner epitaxial layer 241 and the second inner epitaxial layer 242 may be made of a same material.

When the first semiconductor device and the second semiconductor device are PMOS transistors, the first inner epitaxial layer 241 and the second inner epitaxial layer 242 may be made of GeSi. When the first semiconductor device and the second semiconductor device are NMOS transistors, the first inner epitaxial layer 241 and the second inner epitaxial layer 242 may be made of SiC.

The first inner epitaxial layer 241 and the second inner epitaxial layer 242 may be formed by an epitaxial growth process. In one embodiment, the first inner epitaxial layer 241 and the second inner epitaxial layer 242 may be in-situ doped with first doping sources in the epitaxial growth process. In other embodiments, after the epitaxial growth process, an ion implantation process may be applied to the first inner epitaxial layer 241 and to the second inner epitaxial layer 242, to form first doping sources in the first inner epitaxial layer 241 and in the second inner epitaxial layer 242.

When the first semiconductor device and the second semiconductor device are PMOS transistors, the first doping sources may be boron ions. When the first semiconductor device and the second semiconductor device are NMOS transistors, the first doping sources may be arsenic ions and/or phosphorus ions.

A height of the first inner epitaxial layer 241 may be a size of the first inner epitaxial layer 241 along a direction perpendicular to the top surface of the substrate 200, and a width of the first inner epitaxial layer 241 may be a size of the first inner epitaxial layer 241 along a direction perpendicular to the sidewalls of the first fin 201. A height of the second inner epitaxial layer 242 may be a size of the second inner epitaxial layer 242 along a direction perpendicular to the top surface of the substrate 200, and a width of the second inner epitaxial layer 242 may be a size of the second inner epitaxial layer 242 along a direction perpendicular to the sidewalls of the second fin 202.

The first barrier layers 221 may constrain a lateral growth of the first inner epitaxial layer 241 along the width direction of the first fin 201. Increasing the height of the first inner epitaxial layer 241 may make the size of the first inner epitaxial layer 241 along a width direction of the first fin 201 small, but may make the volume of the first inner epitaxial layer 241 being a constant. The method may prevent the first epitaxial layer from contacting or being too close to the second epitaxial layer, and may ensure that the first inner epitaxial layer 241 provides enough strains to the first fin 201. Correspondingly, the leakage currents in the semiconductor structure may be reduced.

The second barrier layers 222 may constrain a lateral growth of the second inner epitaxial layer 242 along the width direction of the second fin 202. Increasing the height of the second inner epitaxial layer 242 may make the size of the second inner epitaxial layer 242 along a width direction of the second fin 202 small, but may make the volume of the second inner epitaxial layer 242 being a constant. The method may prevent the second epitaxial layer from contacting or being too close to the first epitaxial layer, and may ensure that the second inner epitaxial layer 242 provides enough strains to the second fin 202. The leakage currents in the semiconductor structure may be reduced.

When the height of the first inner epitaxial layer 241 is too small, the strains of the first inner epitaxial layer 241 on the channels of the first semiconductor device may be not enough, and mobilities of the channel carriers may be not increased efficiently. When the height of the first inner epitaxial layer 241 is too large, the strains of the first inner epitaxial layer 241 on the channels of the first semiconductor device may increase small when increasing the height of the first inner epitaxial layer 241, and a difficulty in the process may increase. The height of the first inner epitaxial layer 241 may be about 200 Å to about 400 Å.

The width of the first inner epitaxial layer 241 may be constrained by the first barrier layers 221, and may be equal to the width of the first fin 201.

When the height of the second inner epitaxial layer 242 is too small, the strains of the second inner epitaxial layer 242 on the channels of the second semiconductor device may be not enough, and mobilities of the channel carriers may be not increased efficiently. When the height of the second inner epitaxial layer 242 is too large, the strains of the second inner epitaxial layer 242 on the channels of the second semiconductor device may increase small when increasing the height of the second inner epitaxial layer 242, and a difficulty in the process may increase. The height of the second inner epitaxial layer 242 may be about 200 Å to about 400 Å.

The width of the second inner epitaxial layer 242 may be constrained by the second barrier layers 222, and may be equal to the width of the second fin 202.

Figure 10:
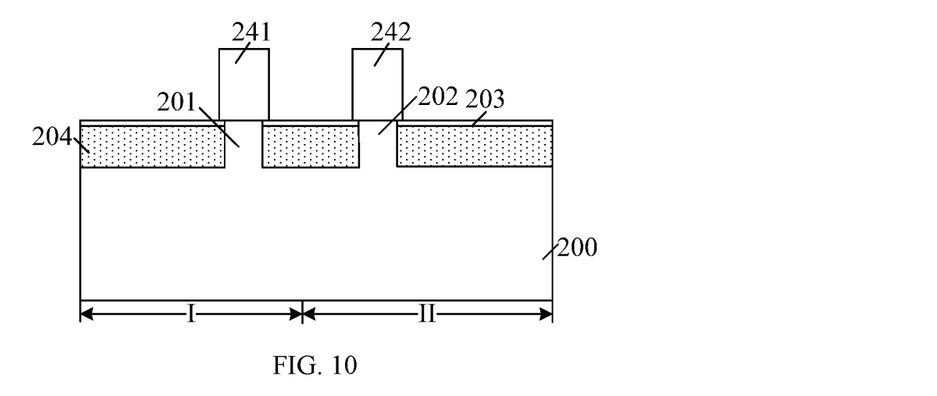

Referring to FIG. 10, after forming the first inner epitaxial layer 241, the first barrier layers 221 may be removed. After forming the second inner epitaxial layer 242, the second barrier layers 222 may be removed (e.g., in Step S818 in FIG. 12).

The first barrier layers 221 may be removed to expose sidewalls of the first inner epitaxial layer 241, and a first outer epitaxial layer may be formed on the sidewalls of each first inner epitaxial layer. The second barrier layers 222 may be removed to expose sidewalls of the second inner epitaxial layer 242, and a second outer epitaxial layer may be formed on the sidewalls of the second inner epitaxial layer.

The first barrier layers 221 and the second barrier layers 222 may be removed by a dry etching process and/or a wet etching process.

Figure 11:
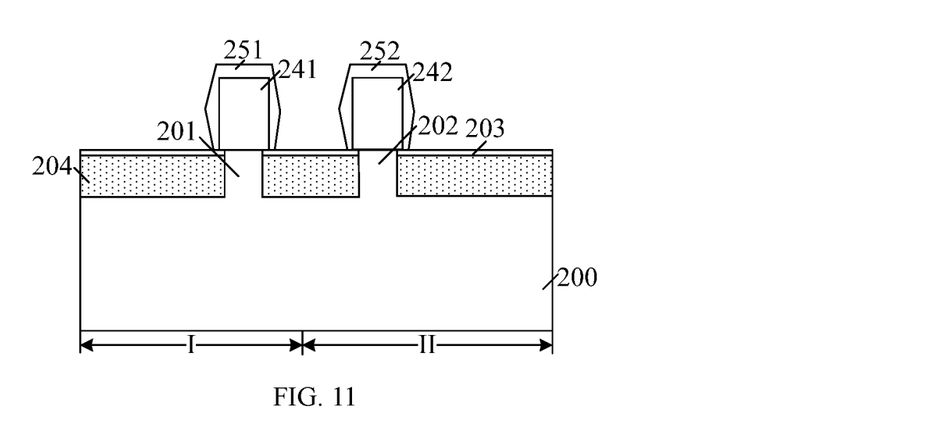
Figure 12:
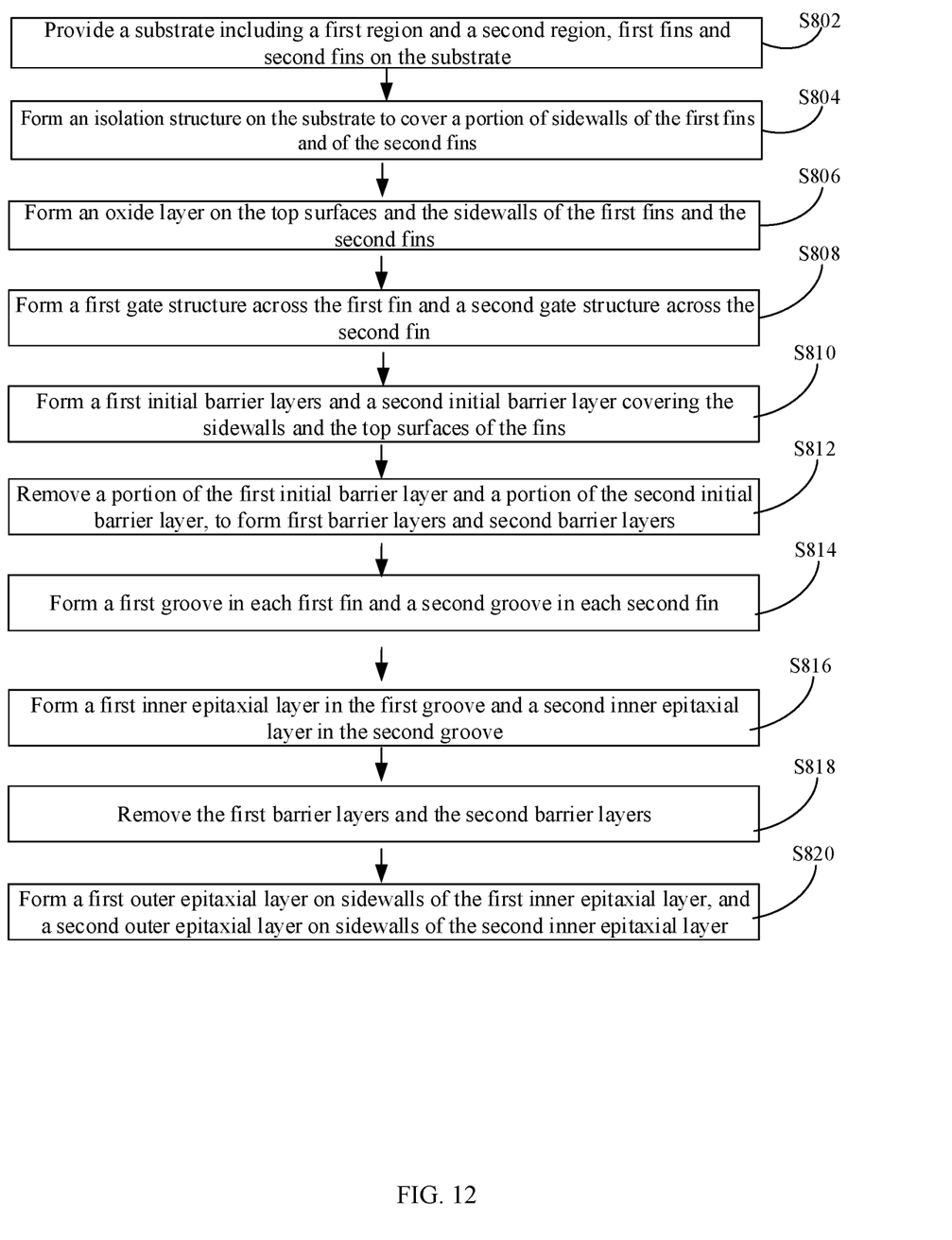
FIG. 12 illustrates an exemplary method for forming a semiconductor structure according to various disclosed embodiments.

Referring to FIG. 11, after removing the first barrier layers 221, a first outer epitaxial layer 251 may be formed on the sidewalls of the first inner epitaxial layer 241. After removing the second barrier layers 222, a second outer epitaxial layer 252 may be formed on the sidewalls of the second inner epitaxial layer 242 (e.g., in Step S820 in FIG. 12).

The first inner epitaxial layer 241 and the corresponding first outer epitaxial layer 251 may together form the first epitaxial layer; and the second inner epitaxial layer 242 and the corresponding first outer epitaxial layer may together form the second epitaxial layer. The first epitaxial layer may be adjacent to the second epitaxial layer.

The first outer epitaxial layer 251 may increase a size of the first epitaxial layer, and increase strains that the first epitaxial layer applies to the first fin 201. The performance of the semiconductor structure may be improved. The second outer epitaxial layer 252 may increase a size of the second epitaxial layer, and increase strains that the second epitaxial layer applies to the second fin 202. The performance of the semiconductor structure may be improved.

In one embodiment, the first epitaxial layer may be used as a source and/or a drain for the first semiconductor device; the second epitaxial layer may be used as a source and/or a drain of the second semiconductor device. In other embodiments, when the first semiconductor device is a diode, the first epitaxial layer may be used as a cathode or an anode for the diode; when a first semiconductor device is a transistor, the first epitaxial layer may be used as a base, a collector or an emitter for the transistor.

In one embodiment, the first outer epitaxial layer 251 may be made of a material same as the first inner epitaxial layer 241. When the first semiconductor device is a PMOS transistor, the first outer epitaxial layer 251 may be made of SiGe; when the first semiconductor device is an NMOS transistor, the first outer epitaxial layer 251 may be made of SiC.

In other embodiments, the first outer epitaxial layer 251 may be made of a material different from the first inner epitaxial layer 241.

In one embodiment, the second outer epitaxial layer 252 may be made of a material same as the second inner epitaxial layer 242. When the second semiconductor device is a PMOS transistor, the second outer epitaxial layer 252 may be made of SiGe; when the second semiconductor device is an NMOS transistor, the second outer epitaxial layer 252 may be made of SiC.

In other embodiments, the second outer epitaxial layer 252 may be made of a material different from the second inner epitaxial layer 242.

When a thickness of the first outer epitaxial layer 251 is too large, the first outer epitaxial layer 251 may contact or be too close to the second outer epitaxial layer 252 easily. When the thickness of the first outer epitaxial layer 251 is too small, the strains of the first inner epitaxial layer 241 on the channels of the first semiconductor device may be not enough, and mobilities of the channel carriers may be not improved efficiently. In one embodiment, the thickness of the first outer epitaxial layer 251 may be about 50 Å to about 100 Å.

When a thickness of the second outer epitaxial layer 252 is too large, the second outer epitaxial layer 252 may contact or be too close to the second outer epitaxial layer 252 easily. When the thickness of the second outer epitaxial layer 252 is too small, the strains of the second inner epitaxial layer 242 on the channels of the second semiconductor device may not be increased enough, and mobilities of the channel carriers may be not increased efficiently. In one embodiment, the thickness of the second outer epitaxial layer 252 may be about 50 Å to about 100 Å.

The first outer epitaxial layer 251 and the second outer epitaxial layer 252 may be doped with second doping sources.

In one embodiment, the first outer epitaxial layer 251 and the second outer epitaxial layer 252 may be formed by a same process. In other embodiments, the first outer epitaxial layer 251 may be formed before or after forming the second outer epitaxial layer 252.

The first outer epitaxial layer 251 and the second outer epitaxial layer 252 may be formed by a second epitaxial growth process. In the second epitaxial growth process, the first outer epitaxial layer 251 and the second outer epitaxial layer 252 may be in-situ doped with the second doping sources.

In other embodiments, the first outer epitaxial layer 251 and the second outer epitaxial layer 252 may be doped with the second doping sources by ion implantation processes.

The second doping sources may have a same conducting type as the first doping sources. In one embodiment, when the first semiconductor device and the second conducting device are PMOS transistors, the second doping sources may be boron ions; when the first semiconductor device and the second conducting device are NMOS transistors, the second doping sources may be arsenic ions and/or phosphorus ions.

In other embodiments, the first semiconductor device may have a type different from the second semiconductor device. For example, when the first semiconductor device is a PMOS transistor, the second conducting device may be an NMOS transistor; when the first semiconductor device is an NMOS transistor, the second conducting device may be a PMOS transistor. Correspondingly, the first epitaxial layer and the second epitaxial layer may be made of different materials, and may be formed by different processes.

Before forming the first groove, a first mask layer may be formed on the sidewalls and on the top surface of the second fin. The first mask layer and the first barrier layers may be formed by: forming a first initial barrier layer on the sidewalls and on the top surface of the first fin and of the second fin; and removing a portion of the first initial barrier layer on the top surface of the first fin, to form the first barrier layers covering the sidewalls of the first fin and to form the first mask layer covering the sidewalls and the top surface of the second fin.

The first epitaxial layer may be formed by: etching the first fin by using the first mask layer and the first gate structure as a mask, to form a first groove in the first fin between the adjacent first barrier layers; form a first inner epitaxial layer in the first groove; removing the first barrier layers after forming the first inner epitaxial layer; and forming a first outer epitaxial layer on a surface of the first inner epitaxial layer after removing the first barrier layers.

The second epitaxial layer may be formed after forming the first epitaxial layer. Before forming the second epitaxial layer, the first mask layer may be removed and a second mask layer may be formed to cover a top surface of the first epitaxial layer and to cover a top surface of the first fin.

The second epitaxial layer may be formed by: etching the second fin by using the second mask layer and the second gate structure as a mask, to form a second groove in the second fin between the adjacent second barrier layers; forming a second inner epitaxial layer in the second groove; removing the second barrier layers after forming the second inner epitaxial layer; and forming a second outer epitaxial layer on the second inner epitaxial layer after removing the second barrier layers.

In one embodiment, the second epitaxial layer may include a second outer epitaxial layer 252 and a second inner epitaxial layer 242. In other embodiments, the second epitaxial layer may only include one layer, and a process for forming the second epitaxial layer may not include forming the second barrier layers. The second epitaxial layer may be formed by forming a second groove in the second fin between the adjacent second barrier layers; and forming a second epitaxial layer in the second groove.

In one embodiment, the first epitaxial layer may include a first inner epitaxial layer 241 and a first outer epitaxial layer 251. In other embodiments, the first epitaxial layer may only include a first inner epitaxial layer, and the process for forming the first epitaxial lay may not include forming the first outer epitaxial layer. In one embodiment, when the first epitaxial layer only includes a first inner epitaxial layer, the first barrier layers may be located on the sidewalls of the first inner epitaxial layer, and the method may not include removing the first barrier layers. In other embodiments, when the first epitaxial layer only includes a first inner epitaxial layer, the first barrier layers may be not located on the sidewalls of the first inner epitaxial layer, and the method may include removing the first barrier layers.

In other embodiments, the second epitaxial layer may only include a second inner epitaxial layer, and the process for forming the second epitaxial layer may not include forming the second outer epitaxial layer. In one embodiment, when the second epitaxial layer only includes a second inner epitaxial layer, the second barrier layers may be located on the sidewalls of each second inner epitaxial layer, and the method may not include removing the second barrier layers. In other embodiments, when the second epitaxial layer only includes a second inner epitaxial layer, the second barrier layers may be not located on the sidewalls of each second inner epitaxial layer, and the method may include removing the second barrier layers.

The present disclosure also provides a semiconductor structure as shown in FIG. 11. The semiconductor structure may include: a substrate 200; first fins 201 on the substrate 200; a first groove in the first fin 201 and through the first fin 201 along a width direction of the first fins 201; a first inner epitaxial layer 241 in the first groove. A size of the first inner epitaxial layer 241 along the width direction of the first fins 201 may be smaller than or equal to a width of the first fins 201.

In one embodiment, the semiconductor structure may further include second fins 202 on the substrate 200; a second groove in the second fin 202; and a second epitaxial layer 242 in the second groove.

In one embodiment, the semiconductor structure may further include a first outer epitaxial layer 251 on the surface of the first inner epitaxial layer 241; and a second outer epitaxial layer 252 on the surface of the second inner epitaxial layer 242.

The first inner epitaxial layer 241 and the first outer epitaxial layer 251 for the first fin 201 may together form the corresponding first epitaxial layer; and the second inner epitaxial layer 242 and the first outer epitaxial layer for the second fin 202 may together form the corresponding second epitaxial layer.

In one embodiment, the semiconductor structure may not include the first outer epitaxial layer on the first inner epitaxial layer; and the second outer epitaxial layer on the second inner epitaxial layer. When the semiconductor structure does not include the first outer epitaxial layer on the first inner epitaxial layer and the second outer epitaxial layer on the second inner epitaxial layer, the semiconductor structure may further include first barrier layers on sidewalls of the first fins and the second barrier layers on sidewalls of the second fin. The first barrier layers and the first fin may surround the first groove. The second barrier layers and the second fin may surround the second groove. In other embodiments, when the semiconductor structure does not include the first outer epitaxial layer and the second outer epitaxial layer, the semiconductor structure may not include the first barrier layers and the second barrier layers.

The first barrier layers and the second barrier layers may be made a material including $SiN_x$, $SiN_xO_y$, and/or $SiO_2$.

In the present disclosure, before forming the first inner epitaxial layer, for the first fin, the first barrier layers may be formed to cover sidewalls of the first fin. The first epitaxial layer may be formed in the first groove between the adjacent first barrier layers. When forming the first inner epitaxial layer, the first barrier layers may constrain a lateral growth of the first inner epitaxial layer along a direction perpendicular to the sidewalls of the first fin, and may allow a growth of the first inner epitaxial layer along a height direction of the first fin. The size of the first inner epitaxial layer along a width direction of the first fin 201 may be small, but the first inner epitaxial layer may still provide enough strains to the corresponding first fin. The first inner epitaxial layer may be prevented from contacting or being too close to other devices on the substrate. Leakage currents in the formed semiconductor structure may be reduced and the performance of the semiconductor structure may be improved.

In the present disclosure, the first outer epitaxial layer may be formed on the surface of the first inner epitaxial layer. The first inner epitaxial layer and the corresponding first outer epitaxial layer may together form the first epitaxial layer. The first barrier layers may constrain a size of the first inner epitaxial layer along a direction perpendicular to the sidewalls of the first fins. The size of the first inner epitaxial layer along a width direction of the first fins may be reduced. Correspondingly, a sum of the size of the first inner epitaxial layer and the size of the first outer epitaxial layer along the width direction of the first fins. The first outer epitaxial layer may be prevented from contacting or being too close to other devices on the substrate. Further, the first outer epitaxial layer may increase the size of the first epitaxial layer as much as possible but still may be prevented from contacting or being too close to other devices on the substrate. The strains on the first fins applied by the first epitaxial layer may be improved, and mobilities of the carriers in the first fins may increase.

The embodiments disclosed herein are exemplary only. Other applications, advantages, alternations, modifications, or equivalents to the disclosed embodiments are obvious to those skilled in the art and are intended to be encompassed within the scope of the present disclosure.

What is claimed is:

1. A fabrication method for a semiconductor structure, comprising:
   providing a substrate;
   forming first fins on the substrate;
   forming first barrier layers covering sidewalls of the first fins;
   forming a first groove in each first fin between adjacent first barrier layers; and
   form a first inner epitaxial layer in each first groove, wherein the first inner epitaxial layer has a bottom wider than the first fins in a direction perpendicular to an extension direction of the first fins.

2. The fabrication method according to claim 1, wherein:
   the first barrier layers are made of $SiN_x$, $SiN_xO_y$, $SiO_2$, or a combination thereof.

3. The fabrication method according to claim 2, wherein the first barrier layers are formed by:
   forming an initial barrier layer on the sidewalls and on top surfaces of the first fins; and
   removing a portion of the initial barrier layer from the top surfaces of the first fins.

4. The fabrication method according to claim 3, wherein:
   the initial barrier layer is formed by a chemical vapor deposition process or an atomic layer deposition process; and
   the portion of the initial barrier layer on the top surfaces of the first fins is removed by an anisotropic dry etching process.

5. The fabrication method according to claim 1, wherein the first barrier layers have a thickness of about 25 Å to about 60 Å.

6. The fabrication method according to claim 1, further including:
   providing second fins on the substrate, wherein second fins and first fins are adjacent to each other; and
   forming a second epitaxial layer in each second fin, wherein the second epitaxial layer and the first inner epitaxial layer are adjacent to each other.

7. The fabrication method according to claim 6, wherein:
   the second epitaxial layer includes a second inner epitaxial layer in the second fin;
   second barrier layers are formed to cover sidewalls of the second fins; and
   the second epitaxial layer is formed by:
   forming a second groove in each second fin between adjacent second barrier layers, wherein the second barrier layers surround a portion of sidewalls of the second groove; and
   forming a second inner epitaxial layer in the second groove.

8. The fabrication method according to claim 7, wherein:
   the second epitaxial layer includes a second outer epitaxial layer on the second inner epitaxial layer; and
   forming the second epitaxial layer further includes:
   after forming the second inner epitaxial layer, removing the second barrier layers; and
   after removing the second barrier layers, forming a second outer epitaxial layer on the second inner epitaxial layer.

9. The fabrication method according to claim 7, wherein:
   the second barrier layers are made of a material including $SiN_x$, $SiN_xO_y$, $SiO_2$, or a combination thereof.

10. The fabrication method according to claim 6, wherein:
    the second epitaxial layer and the first inner epitaxial layer are made of different materials;
    before forming the first groove, the method further includes: forming a first mask layer on sidewalls and top surfaces of the second fins; wherein:
    the first mask layer and the first barrier layers are formed by: forming a first initial barrier layer on the sidewalls and the top surfaces of the first fins and of the second fins; and removing a portion of the first initial barrier layer on the top surfaces of the first fins, to form the first barrier layers covering the sidewalls of the first fins, and to form the first mask layer covering the sidewalls and the top surfaces of the second fins;

after forming the first inner epitaxial layer, the second epitaxial layer is formed; and before forming the second epitaxial layer, the first mask layer is removed and a second mask layer is formed to cover the first inner epitaxial layer and the top surfaces of the first fins.

11. The fabrication method according to claim 6, before forming the second epitaxial layer, further including:

forming second gate structures across the second fins to cover a portion of sidewalls and a portion of top surfaces of the second fins, wherein the second epitaxial layer is located in the second fins on two sides of each second gate structure.

12. The fabrication method according to claim 6, before forming the first inner epitaxial layer, further including:

forming first gate structures across each first fin to cover a portion of the sidewalls and a portion of top surfaces of the first fins, wherein the first epitaxial layer is located in the first fins on sides of each first gate structure.

13. The fabrication method according to claim 1, further comprising:

forming an oxide layer on the sidewalls of the first fins before forming the first barrier layers.

14. The fabrication method according to claim 13, wherein:

forming the first groove in each first fin between the adjacent first barrier layers includes removing the oxide layer on the sidewalls of the first fins.

15. A fabrication method for a semiconductor structure, comprising:

providing a substrate;

forming first fins on the substrate;

forming first barrier layers covering sidewalls of the first fins;

forming a first groove in each first fin between adjacent first barrier layers;

form a first inner epitaxial layer in each first groove; and removing the first barrier layers after forming the first inner epitaxial layer.

16. The fabrication method according to claim 15, wherein:

after removing the first barrier layers, a first outer epitaxial layer is formed on the first inner epitaxial layer.

17. The fabrication method according to claim 16, wherein:

the first inner epitaxial layer is formed by a first epitaxial growth process; and the first outer epitaxial layer is formed by a second epitaxial growth process.

18. The fabrication method according to claim 16, wherein:

when the first inner epitaxial layer and the first outer epitaxial layer are used as a source/drain of a formed PMOS transistor, the first inner epitaxial layer is made of a material including silicon and SiGe, and the first outer epitaxial layer is made of a material including silicon and SiGe; and when the first inner epitaxial layer and the first outer epitaxial layer are used as a source/drain of a formed NMOS transistor, the first inner epitaxial layer is made of a material including silicon and SiC, and the first outer epitaxial layer is made of a material including silicon and SiC.

19. The fabrication method according to claim 16, wherein:

the first inner epitaxial layer has a height of about 200 Å to about 400 Å; and the first outer epitaxial layer has a thickness of about 50 Å to about 150 Å based on a surface of the first inner epitaxial layer in a direction perpendicular to the surface of the first inner epitaxial layer.

* * * * *